US006274807B1

(12) United States Patent
Pommerenke et al.

(10) Patent No.: US 6,274,807 B1
(45) Date of Patent: *Aug. 14, 2001

(54) METHOD AND APPARATUS FOR CONTROLLING ELECTROMAGNETIC RADIATION EMISSIONS GENERATED BY ELECTRICAL COMPONENTS (75) Inventors: David Pommerenke, Rocklin; David Dickey, Auburn; James J DeBlanc, Roseville; Victoria Tsang, Davis, all of CA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/191,962

(22) Filed: Nov. 13, 1998

(51) Int. Cl.[7] ............................................. H05K 9/00

(52) U.S. Cl. ................... 174/35 GC; 174/35 R; 361/800

(58) Field of Search .................. 174/35 R, 35 MS, 174/35 GC; 361/816, 818, 799, 800

(56) References Cited

U.S. PATENT DOCUMENTS

| 3,846,608 | * | 11/1974 | Valles | 219/741 |
| 4,631,641 | * | 12/1986 | Brombal et al. | 361/818 |
| 4,948,922 | * | 8/1990 | Varadan et al | 174/35 GC |

* cited by examiner

Primary Examiner—Dean A. Reichard
Assistant Examiner—Hung V Ngo (57) ABSTRACT

A method and apparatus is provided for reducing or eliminating the amount of electromagnetic radiation being emitted from a system assembly comprising one or more subassemblies which comprise electrical circuits which generate electromagnetic radiation. The method and apparatus of the present invention also reduce or prevent electromagnetic radiation generated by sources outside of the system assembly from interfering with and adversely affecting the electrical circuits comprised in the subassemblies. To achieve these goals, the present invention provides an electromagnetic compatibility (EMC) solution which comprises a plurality of lossy elements, and/or elements comprised of a combination of lossy and conductive material, to reduce electromagnetic radiation. Thus, the conventional EMC solution, which utilizes conductive gaskets on system assemblies and subassemblies, and which requires adequate contact between parts in order to be effective, is replaced by the EMC solution of the present invention, which is more effective at higher frequencies and does not have stringent contact requirements.

16 Claims, 6 Drawing Sheets

METHOD AND APPARATUS FOR CONTROLLING ELECTROMAGNETIC RADIATION EMISSIONS GENERATED BY ELECTRICAL COMPONENTS

TECHNICAL FIELD OF THE INVENTION

The present invention generally relates to a method and apparatus for controlling electromagnetic radiation being emitted from electrical components. More particularly, the present invention relates to a method and apparatus for using lossy materials, or a combination of lossy and conductive materials, on the exterior surfaces of electrical modules, or subassemblies, comprised within a larger electrical system assembly, such as, for example, a computer system assembly or a data storage system assembly, to prevent or reduce electromagnetic radiation emissions. The use of lossy material or a combination of lossy and conductive materials in this manner also provides immunity to electromagnetic radiation interference by preventing electromagnetic radiation generated by sources outside of the electrical system assembly from adversely affecting the electrical circuitry of the system assembly and subassemblies.

BACKGROUND OF THE INVENTION

Electrical components emit electromagnetic radiation. The Federal Communications Commission (FCC) regulates the amount of electromagnetic radiation that can be emitted form various classes of electrical and electronic devices by promulgating regulations that dictate the maximum amount of electromagnetic radiation that may be emitted form different types of electrical and electronic devices. With respect to computer systems and data storage systems, manufacturers typically control the amount of electromagnetic radiation emissions by suing conductive enclosures and gaskets to prevent electromagnetic radiation from being emitted from the assemblies. Conductive gaskets and conductive enclosures reflect radiation impinging on them and thereby prevent the radiation from escaping from the assemblies into the outside environment.

Conductive gaskets and enclosures generally are superior at controlling emissions as long as contact between conductive parts of the enclosure is continuous and the interfaces between parts of the enclosure are of low impedance. If contact between parts is not continuous, or if the interfaces between conductive parts are of high impedance, the effectiveness of the conductive enclosure or gasket as a shield will be greatly diminished. Therefore, the efficiency of the shield may be adversely affected by surface conditions and/or by inadequate contact pressure between parts is not maintained at all times.

One problem associated with using these types of conductive shields is that it is difficult to ensure that adequate contact pressure is maintained between parts due to mechanical tolerance variations. Also, aging of materials used to maintain contact between parts, such as, for example, polymers which function as springs to force conductive parts into contact, often results in adequate contact being lost over time. Therefore, it is difficult, in many cases, to ensure that adequate contact will be maintained over time, and therefore difficult to ensure the effectiveness of the conductive shielding over time.

Also, ensuring adequate contact between conductive parts of enclosures of electrical components often significantly increases the overall size of the assembly comprising the subassemblies since additional structure or treatment processes (e.g., flanges, collars, surface treatment, etc.) is required in order to ensure contact between the enclosures. Furthermore, additional structure and/or surface treatment generally translates into additional costs. The requirement that surface conditions not prevent adequate contact between parts also affects the appearance of the system assembly and/or subassemblies. For example, in many cases, the surfaces must be left exposed and cannot be painted. Furthermore, the implementation of subassemblies provided by different vendors (e.g., power supplies provided by different vendors) is limited by the requirement that the surface conditions of the various subassemblies provide adequate contact. Slight variations in surface characteristics make it difficult to achieve effective shielding.

Another problem associated with conductive shielding is that, with high frequencies, it is extremely difficult to ensure that contact between parts is adequate to control emissions. Therefore, as frequencies increase, conductive shields become less effective and other methods must be implemented to control electromagnetic radiation emissions.

It is generally known that lossy materials can be used to control electromagnetic radiation emissions. Lossy materials are materials which absorb and attenuate, and only partially reflect, electromagnetic radiation energy. The ratio of absorption-to-reflecting is determined by the electromagnetic radiation properties of the material and by the electromagnetic properties of the radiation impinging on the lossy material. However, it is not known to use lossy materials on the outside of enclosures, or housings, and between subassembly housings and a chassis on which the subassembly housings are mounted, to provide an EMC solution. With respect to these types of system assemblies, conductive gaskets and materials have been used as an EMC solution for a variety of reasons.

Low RF frequencies can be effectively dealt with using conductive gaskets and materials because conductive contact between parts does not have to be as continuous in order to ensure effective shielding, i.e., larger gaps can exist between parts while still maintaining effective shielding. Also, with these types of system assemblies, conductive shielding has been used not only for electromagnetic compatibility, commonly referred to as EMC, but also to ground various subassembly housings in order to eliminate residual voltages which may exist between parts of the chassis of the system assembly. Thus, implementing conductive shielding has been viewed as being advantageous since it performs both of these functions.

Currently computer system assemblies and data storage system assemblies implement EMC solutions which utilize conductive enclosures and conductive gaskets. As computer systems and data storage systems are developed which operate at exceedingly higher frequencies, with significant emissions at frequencies larger than approximately 1 GHz, a need will exist for an EMC solution which is effective in controlling emissions at higher frequencies and which does not diminish ineffectiveness over time due to aging or with increasing frequency. At higher frequencies, conductive shielding is less effective because continuity of contact between conductive subassemblies must be maintained in order to ensure effective shielding, which, as discussed above, is very difficult in many cases, especially above 1 GHz.

In order to meet this need for an EMC solution which is effective for controlling electromagnetic radiation emissions in system assemblies at higher frequencies, the present invention provides and EMC solution which utilizes lossy materials, or a combination of lossy and conductive materials, within an electrical system assembly, such as a computer system assembly or a data storage system assembly, on the exterior of subassembly housing and/or on the chassis of the assembly.

The EMC solution of the present invention controls the emission of electromagnetic radiation from the system assembly enclosure into the outside environment as well as the emission of electromagnetic radiation within the system assembly enclosure from subassemblies, or modules, of the system which may interfere (i.e., EMI) with the operation of other subassemblies or modules of the system. Furthermore, the EMC solution of the present invention is relatively inexpensive and overcomes problems associated with surface conditions required for ensuring contact between subassembly enclosures and the overall system enclosure.

SUMMARY OF THE INVENTION

The present invention provides a method and apparatus for reducing or eliminating electromagnetic radiation being emitted from a system assembly comprising one or more subassemblies which comprise electrical circuits which generate electromagnetic radiation. The present invention also reduces or eliminates electromagnetic radiation generated outside of the system assembly form adversely affecting the electrical circuits comprised in the subassemblies. To achieve these goals, the present invention provides an electromagnetic compatibility (EMC) solution which comprises a plurality of lossy elements, and/or elements comprised of a combination of lossy and conductive material, to reduce electromagnetic radiation.

The elements comprising the EMC solution of the present invention may be placed on the enclosures of the subassemblies and/or on the chassis of the system assembly and are placed in the electromagnetic energy path between the source of the electromagnetic energy and the outside world. The elements comprising the EMC solution may be comprised of materials including, but not limited to, conductive polyethylene, conductive rubber and magnetically-filled silicon rubber. The EMC solution of the present invention is more effective at higher frequencies than conductive gaskets are and problems associated with surface contact requirements and surface characteristics are avoided.

These and other features and advantages of the present invention will become apparent from the following description, drawings and claims.

DETAILED DESCRIPTION OF THE INVENTION

Figure 1:
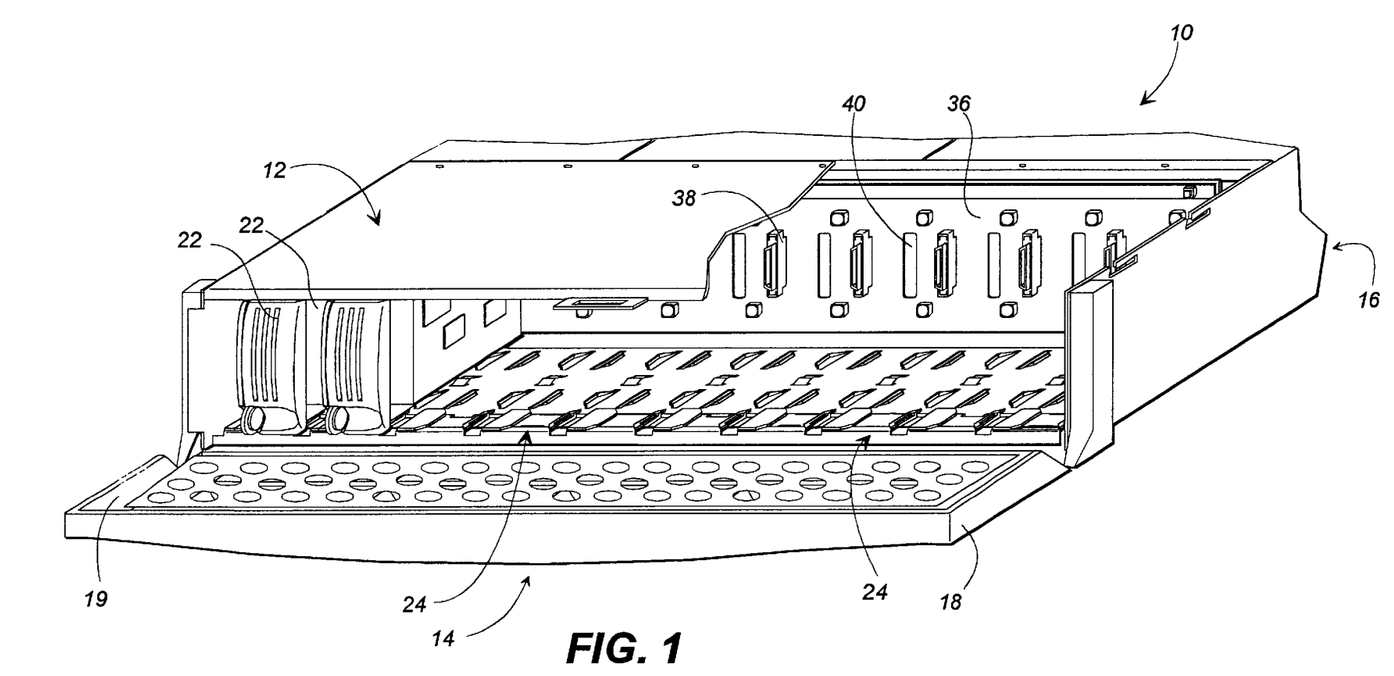
FIG. 1 is a front perspective view of an electrical system assembly designed to hold a plurality of electrical component modules which may emit electromagnetic radiation.
Figure 2:
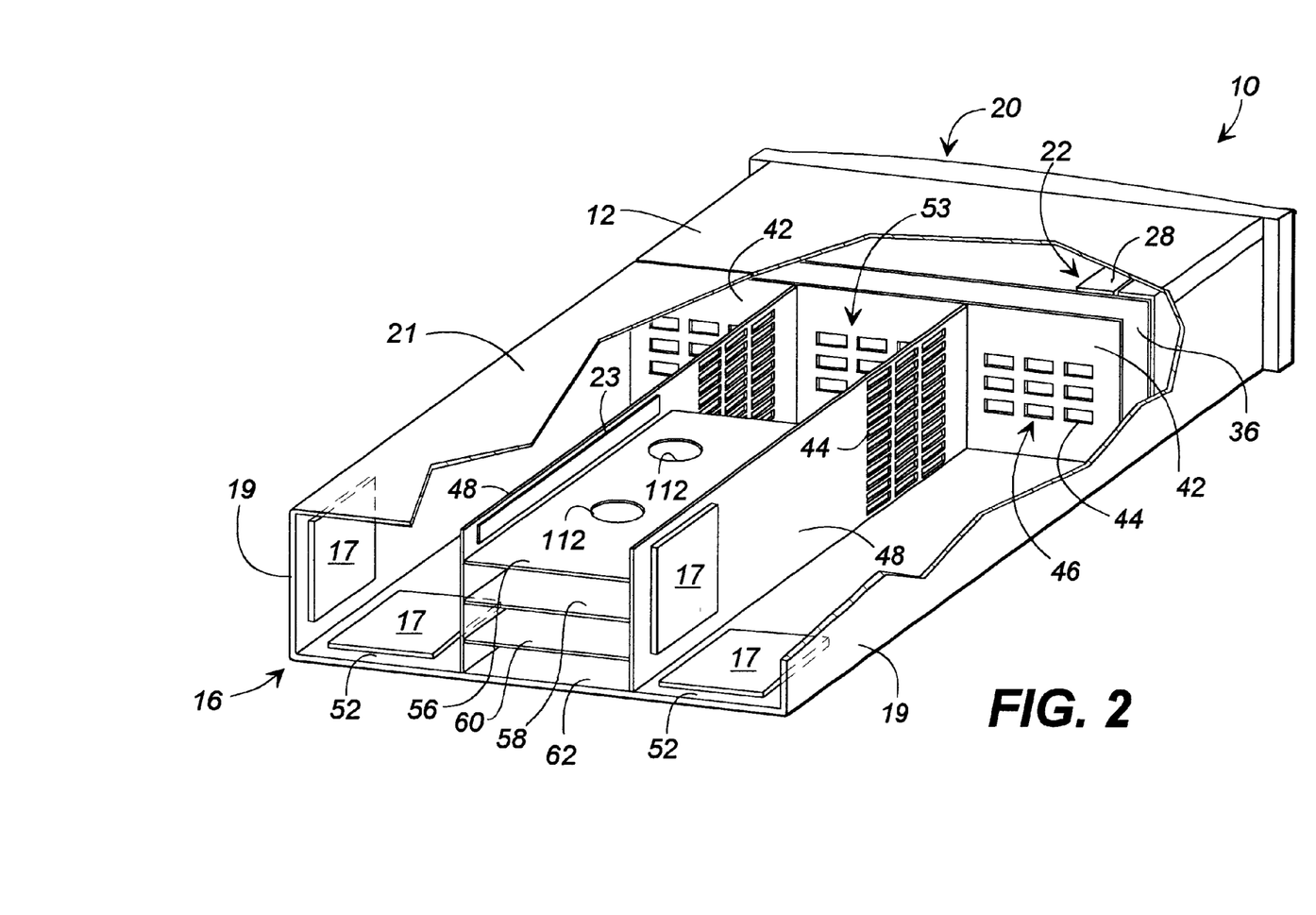
FIG. 2 is a rear perspective view of the electrical system assembly shown in FIG. 1.

FIGS. 1 and 2 illustrate an electrical system assembly 10 with which the present invention can be utilized in order to control electromagnetic radiation emissions. The electrical system assembly 10 may be, for example, a data storage system assembly. Those skilled in the art will understand that the present invention may be utilized with any type of electrical system assembly that generates electromagnetic radiation emissions that need to be controlled. Before a discussion is provided of the manner in which the method and apparatus of the present invention can be utilized to control electromagnetic radiation emissions, a discussion of the structure of the electrical system assembly 10 and of the modules housed therein will first be provided and then a discussion will be provided of the manner in which the EMC solution of the present invention is utilized in conjunction with the electrical system assembly 10 and the modules housed therein.

The electrical system assembly 10 comprises a substantially rectilinear enclosure, or chassis, 12 having front and rear ends 14 and 16. Pivotally mounted at the front end 14 of the subassembly enclosure 12 is an enclosure door 18 which provides access to the electrical system assembly 10. The electrical system assembly 10 is adapted to receive a plurality of modules 22 therein, which may be, for example, data storage modules 22. The modules 22 are received in the enclosure 12 in a plurality of bay slots 24. Each data storage module 22 may comprise a data storage device 28, such as, for example, a disk drive.

Positioned inside of the subassembly enclosure 12 is a main circuit board, generally referred to as a backplane 36. The backplane 36 includes a plurality of electrical connectors 38, such as, for example, multiple pin connectors, and a plurality of airflow openings 40. Typically, there is one electrical connector 38 and one airflow opening 40 aligned with each bay slot 24 of the subassembly enclosure 12 such that each module 22 aligns with its own electrical connector and airflow opening.

With reference to FIG. 2, the electrical system assembly 10 further comprises a transverse wall 42 which spans the width of the assembly 10. The transverse wall 42 is oriented substantially parallel to the backplane 36. Extending from the transverse wall 42 to the end of the subassembly enclosure 12 are longitudinal walls 48. Together, the longitudinal walls 48, the transverse wall 42, and the walls of the subassembly enclosure 12 define two power supply module housings 52. Extending between the longitudinal walls 48 in substantially parallel planes are a plurality of trays that, together with the longitudinal walls 48 define a first daughter board housing 56, a first air mover pack housing 58, a second air mover pack housing 60, and a second daughter board housing 62.

Figures 3, 4:
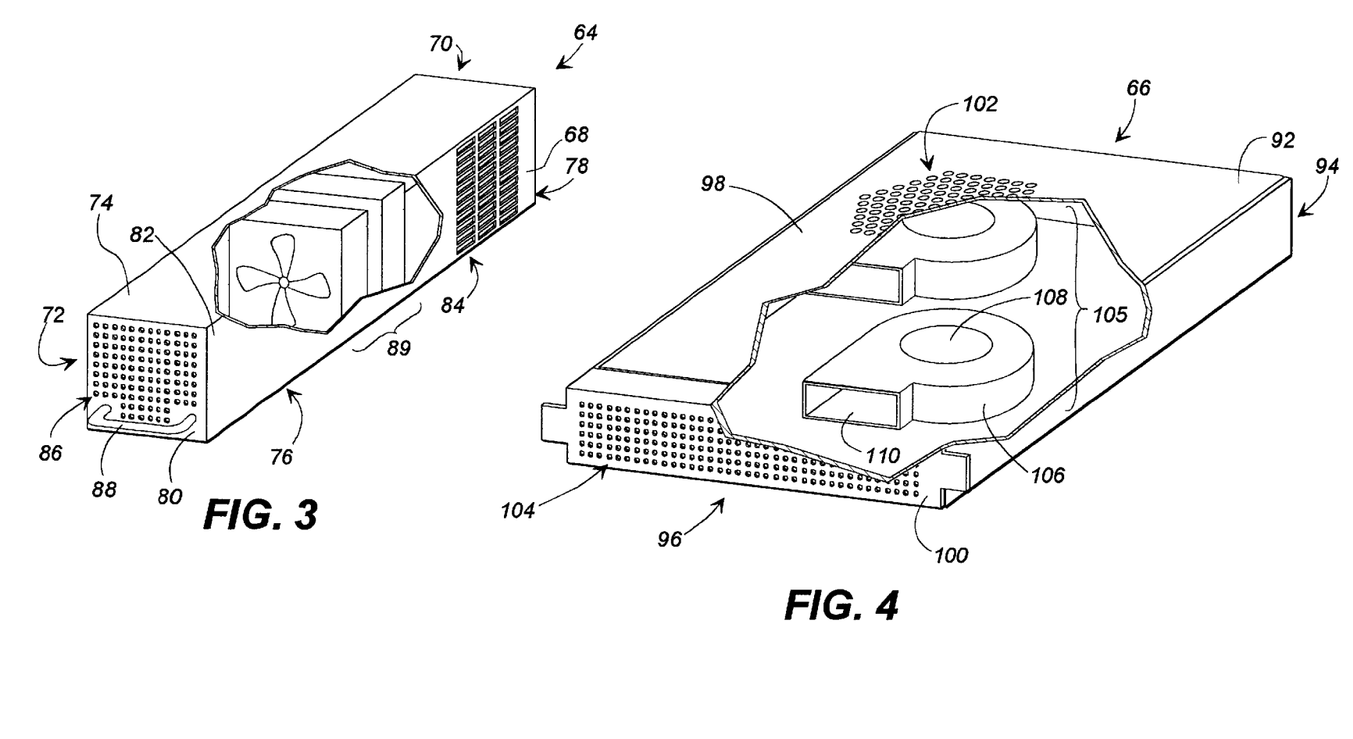
FIG. 3 is a rear perspective view of a power supply module housed in the electrical system assembly shown in FIGS. 1–2.
FIG. 4 is a rear perspective view of an air mover pack module housed in the electrical system assembly shown in FIGS. 1–2.
Figure 5:
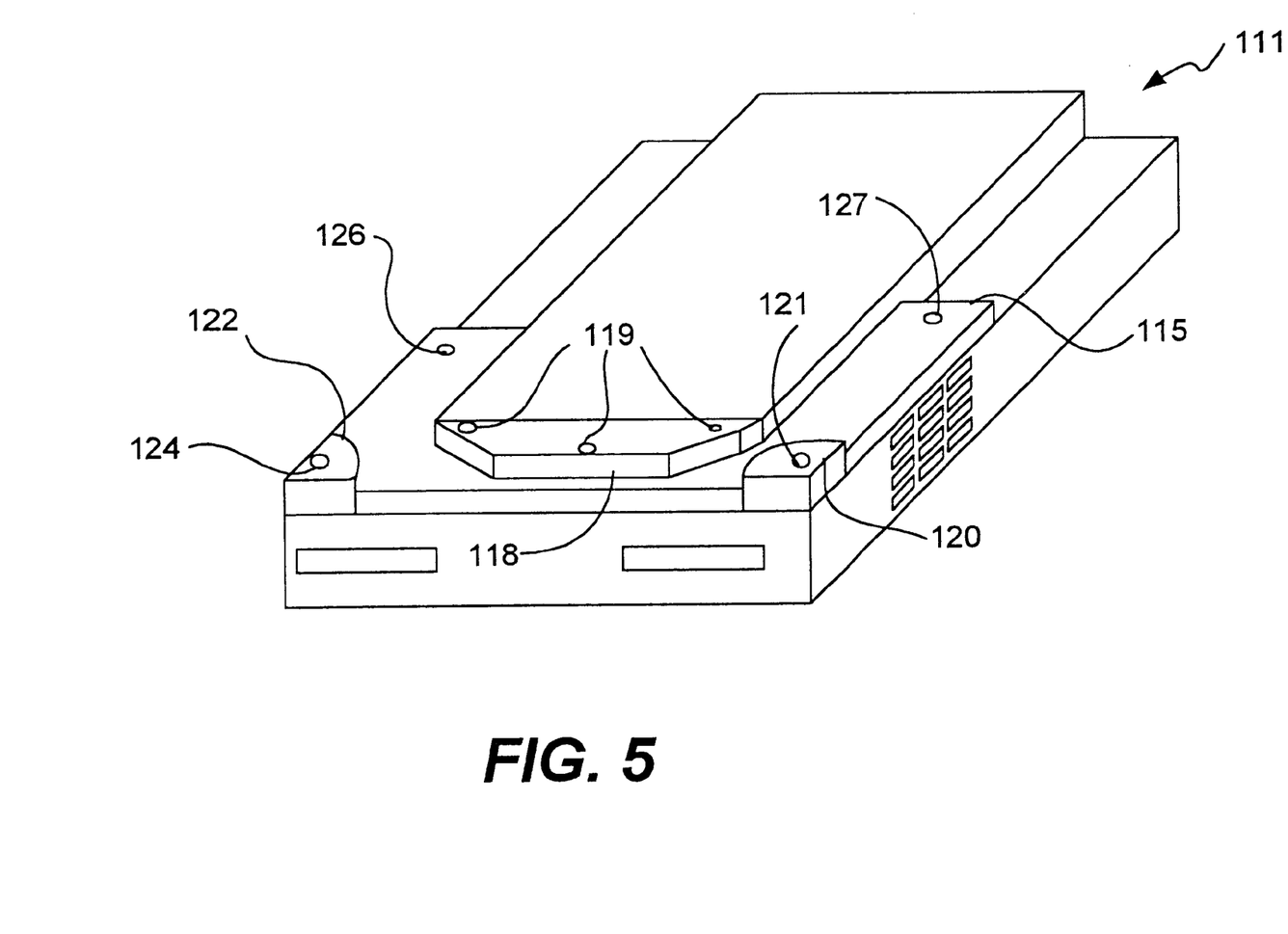
FIG. 5 is a perspective view of a daughter board module housed in the electrical system assembly shown in FIGS. 1 and 2.

FIGS. 3, 4 and 5 depict a power supply module 64, a modular air mover pack 66, and a daughter board assembly 111, respectively. The power supply module 64, the modular air mover pack 66, and the daughter board assembly 111 are adapted to be slidably inserted into the power supply module housings 52, the air mover pack housing 58 and 60, and the daughter board housings 56 and 62, respectively. All of these subassemblies generate electromagnetic radiation emission which need to be controlled.

As shown in FIG. 3, the power supply module 64 comprises a substantially rectilinear enclosure 68 that includes front and rear ends 70 and 72, respectively, and a top side 74, a bottom side 76, a front side 78, a rear side 80, and opposed lateral sides 82. At the front end 70 of the module 64 are a plurality of perforations 84 which together form an air inlet. Similarly, the rear end 72 of the enclosure 68 is provided with a plurality of perforations 86 which together form an exhaust outlet. Attached to the rear side 80 of the module 64 is a handle 88 which facilitates insertion and removal of the module 64 into the subassembly enclosure 12.

As illustrated in FIG. 4, the air mover pack 66 comprises a substantially rectilinear enclosure 92 that includes front and rear ends 94 and 96, and at least top and rear sides 98 and 100. The top side 98 is provided with at least one perforated area 102 which forms an air inlet. In addition, the rear side 100 of the enclosure 92 is provided with a plurality of perforations 104 which form an exhaust outlet. Mounted inside the pack enclosure 92 is a set 105 of at least one air mover 106. Normally, two such air movers 106 are arranged directly adjacent each other in series, each being formed as a centrifugal fan having an inlet port 108 and an exhaust port 110. The air movers 106 are positioned within the enclosure 92 such that the inlet ports 108 are aligned with one of the perforated areas 102 of the enclosure and the outlet port 110 face the perforations 104 of the rear side 100 of the enclosure. The air movers 106 draw in air from outside the enclosure 92 through the perforated areas 102 and expel it from the enclosure through the perforations 104.

FIG. 5 is a perspective view of a daughter board module 111 while is housed in the first daughter board housing 56 shown in FIG. 2. This daughter board module 111 is a source of EMI which needs to be contained or attenuated. An identical daughter board module may be housed in the second daughter board housing 62 shown in FIG. 2. The daughter board module 111 may be, for example, an input/output (I/O) card. The manner in which the EMC solution of the present invention is applied to the electrical system assembly 10 and to the subassemblies housed therein will now be described. However, it should be noted that the following discussion of potential applications of the EMC solutions of the present invention is only an exemplary demonstration of the manner in which the EMC solution of the present invention may be implemented. Those skilled in the art will understand that the present invention is not limited with respect to the types of lossy and/or conductive materials utilized, with respect to the dimensions or mechanical characteristics of the EMC solution, or with respect to the locations of a system assembly at which the EMC solution of the present invention is applied.

With respect to FIG. 1, in accordance with one exemplary implementation of the present invention, the door 18 has the EMC solution applied thereto in the form of a strip of lossy material, or a combination of lossy and conductive material, attached to a molded indentation 19 about the periphery of the door 18. Preferably, the EMC solution applied in this particular application is a strip comprising a combination of lossy and conductive material. The lossy material occupying the center of the strip and the conductive material occupying the periphery of the strip.

Figure 6:
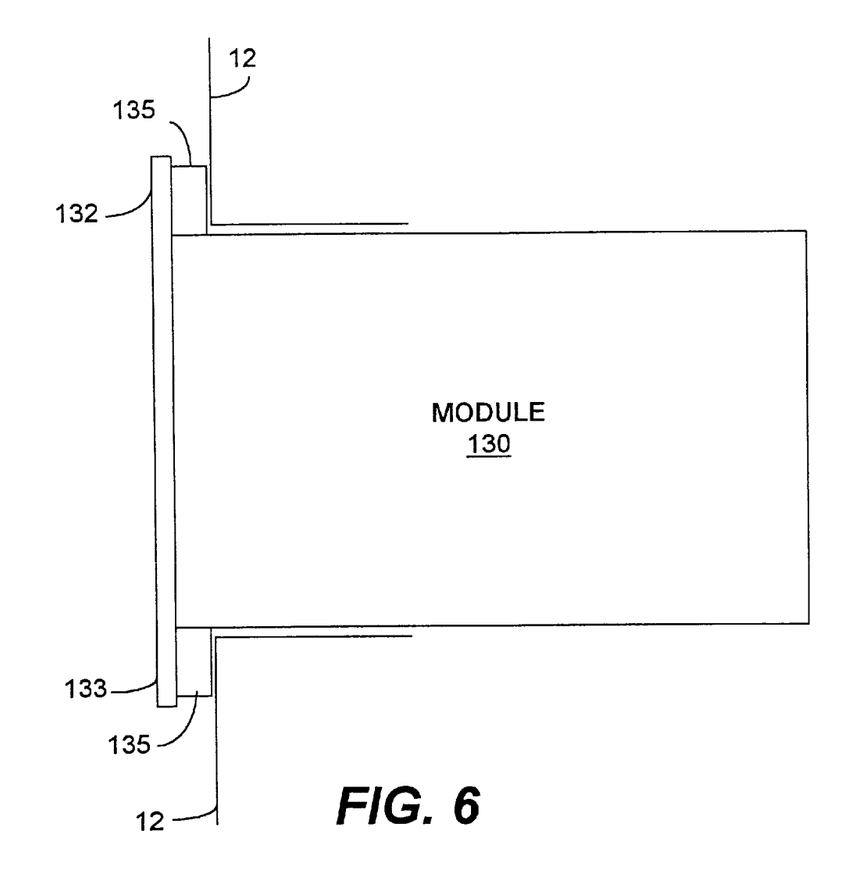
FIG. 6 illustrates one embodiment of the EMC solution of the present invention which utilizes a gasket comprised of lossy material.
Figure 7A:
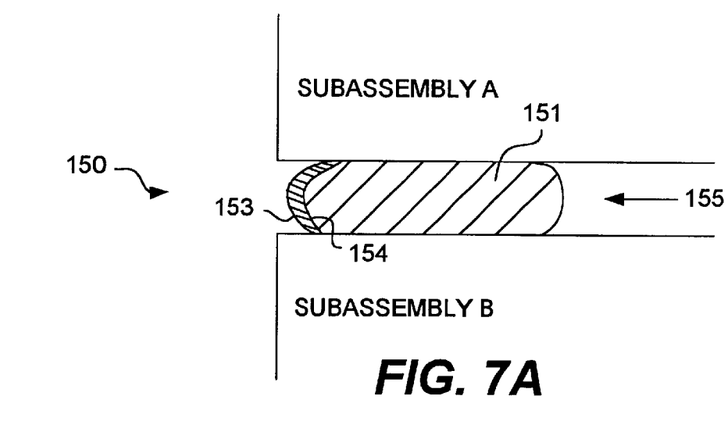
FIGS. 7A and 7B illustrate exemplary forms of the EMC elements of the present invention.
Figure 7B:
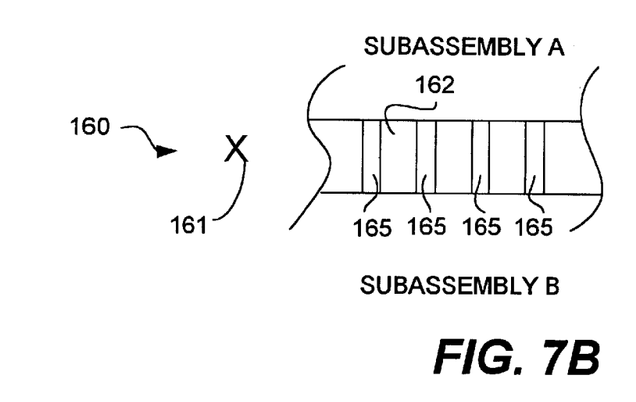

The lossy material, and/or the lossy/conductive material, may be secured to the indentation 19 by any suitable attachment mechanism, such as, for example, adhesive (not shown). The door may be comprised of, for example, a plastic material having a metalized surface (not shown). The door 18 and the chassis of the enclosure 12 preferably are designed so that when the door 18 is placed in the closed position (not shown), the conductive material of the EMC strip contacts the conductive enclosure 12 and the lossy material fills any gaps where continuous contact may not be provided between the conductive material of the EMC strip and the enclosure 12. In this way, any emissions not shielded as a result of the contact between the conductive material of the EMC strip and the enclosure 12 will be absorbed by the lossy material of the EMC strip. An EMC element which is comprised of a lossy material or a combination of lossy and conductive materials can be designed and implemented in a variety manners. FIGS. 6–7B, discussed below, demonstrate some exemplary embodiments of the manner in which the EMC solution of the present invention may be designed and implemented.

The transverse wall 42 and the longitudinal walls 48 have air openings 44 formed therein to enable air to be circulated through the assembly 10 by the air mover packs 66. Preferably, sheets (not shown) of lossy material having openings formed therein which match up with the air openings 44 are secured to the transverse walls 42 and 48 to allow air to be circulated within the enclosure 12 while also attenuating electromagnetic radiation impinging on the sheets of lossy material. Also, preferably, lossy material is placed in the cavity 53, which normally has a significant amount of empty space. A sheet of lossy material having appropriate air openings and openings for connectors may also be placed between wall 42 and backplane 36. However, as stated above, all of these locations are merely preferred, or candidate, locations for the lossy material or lossy and conductive material of the present invention.

With respect to FIG. 2, the EMC solution of the present invention preferably is applied at a plurality of locations. For example, a strip 17 of lossy material, or of lossy and conductive material, is applied to the side walls 19 and 48 and to the top walls 21 of the power supply housings 52. A strip 23 of lossy material, or a strip of lossy and conductive material, is applied to the side wall 48 of the daughter board housings 56 and 62. Although only one strip 23 is shown in FIG. 2 affixed to the side wall 48 of housing 56, an identical strip (not shown) is affixed to the opposite side wall 48 designing housing 56 and to the side walls defining the housing 62 in an identical manner.

Preferably, the strip 17 is comprised of a comprised of a combination of lossy and conductive material, with the conductive material being disposed on a portion of the strip 17 closest to the rear end 16 of the chassis 12. Similarly, preferably the strip 23 is comprised of a combination of lossy and conductive material, with the conductive material being disposed on a portion of the strip 23 closest to the rear end 16 of the chassis 12. By using a combination of conductive and lossy material for the strips 17 and 23 in this manner, electromagnetic radiation propagating toward the rear 16 of the chassis 12 will be partially absorbed by the lossy material of the strips and then reflected toward the front end of the chassis 12 where it is absorbed by the lossy material of the strips.

The daughter board module 111 has a horseshoe-shaped strip of lossy material 115 secured thereto by fasteners 121, 124, 126 and 127. These fasteners can be any type of fastener such as, for example, screws, rivets, etc. Also, a different type of securing mechanism such as, for example, an adhesive, may also be used for this purpose. A second strip of lossy material 118, which is thicker than strip 115, is attached to the daughter board 111 by fasteners 119 at the locations shown.. Alternatively, the strips 115 and 118 may be comprised of a combination of lossy and conductive materials.

In the exemplary embodiment of FIG. 5, the locations of the strips 115 and 118 was chosen for convenience and because it was determined that the strips would be effective at these locations for absorbing emissions. The locations at which the EMC elements of the present invention are disposed can be any suitable location, but typically will be disposed at locations where the field strength is the greatest and where they can be conveniently located. Also, the EMC elements can vary in thickness and can be comprised as a single, integrated unit or as a plurality of units.

FIG. 6 illustrates another form of the EMC solution of the present invention which utilizes a gasket comprised of lossy material. As shown in FIG. 6, a module 130 to be mounted to the chassis 12 of the assembly 10 has opposing flanges 132 and 133 which are separated from the chassis 12 by a lossy gasket 135. Conventional techniques implement a metal, compressible gasket (not shown) in order to provide continuous contact between the metal flanges 132 and 133 and the chassis 112. However, as stated above, the conventional technique may be very difficult to implement and its results are not very effective for shielding electromagnetic radiation emissions when relatively high frequencies are involved. By using a lossy gasket 135 in the manner shown in FIG. 6 about the periphery of a module 130, electromagnetic radiation emissions are effectively absorbed and the difficulties associated with implementing a metal gasket are avoided.

It should be noted that it is unnecessary of the lossy material to completely fill the gap between the subassemblies, nor is it necessary for the lossy material to be in physical contact with the subassemblies. This eliminates the need for contact pressure and provides many options with respect to the surface characteristics, such as, for example, aesthetic design, mechanical tolerances of subassemblies, etc.

FIGS. 7A and 7B illustrate other forms of the EMC elements of the present invention. FIG. 7A illustrates an EMC element 150 which is composed of lossy material 151 in the center and of conductive material about the edges of the element 150, which are designated by the shaded areas within the regions defined by numerals 153 and 154 on one end of the material 151. Radiation propagating through the gap between subassemblies A and B in the direction indicated by arrow 155 will be absorbed by the lossy material 151 as it passes through the lossy material 151 and any radiation that is not absorbed will be reflected by the conductive material within the regions defined by the numerals 153 and 154. Any reflected radiation will then be further absorbed by the lossy material 151.

In FIG. 7B, the EMC element 160 is also comprised of a combination of lossy material and conductive material. The "X" designated by numeral 161 represents the direction of the electromagnetic radiation with respect to the EMC element 160 and subassemblies A and B (i.e., radiation going into the plane of the drawing page). The conductive material is indicated by the bands 165 which pass through a cross-section of the element 160 and the lossy material 162 is comprised elsewhere in the element 160. The conductive material 165 reflects radiation and the lossy material 162 absorbs radiation. This configuration is suitable in cases where, for example, implementing a conductive gasket would require so much contact pressure that the subassemblies A and B would be deformed by the pressure.

A variety of materials are suitable for creating the EMC element of the present invention. Preferably, a conductive polyethylene is used for the lossy material. Desco Corporation manufacturers a dielectrically lossy polyethylene, known as conductive polyethylene material P, which is suitable for use as the EMC element of the present invention.

Another material which is suitable for this purpose is a dielectrically lossy polyethylene sold by Com-Kyl, Inc., known as Crystal X. Cumming Microwave Corporation manufacturers several materials which are suitable as the EMC element of the present invention. Examples include the dielectrically lossy C-RAM ALU-25-neoprene and the magnetically-filled silicon rubber material C-RAM GDSS and C-RAM FDSS. However, it will be understood by those skilled in the art that the present invention is not limited to these materials which is known as It should be noted that the present invention has been described with respect to particular embodiments but that the present invention is not limited to these embodiments. It will be understood by those skilled in the art that modifications may be made to the embodiments discussed herein which are within the scope of the present invention.

What is claimed is:

1. A system assembly comprising:
   a housing and a plurality of subassemblies housed within the housing, the housing being comprised of a metallic material, the housing having at least two longitudinal walls and a transverse wall, each of the subassemblies comprising electrical circuitry, each subassembly having at least a partial enclosure which at least partially encloses the electrical circuitry comprised by the subassembly, each enclosure having at least one longitudinal side that is parallel to the longitudinal walls of the housing, each enclosure having at least one transverse side that is parallel to the transverse wall of the housing, the transverse dimension of each enclosure being less than the longitudinal dimension of the enclosure such that each enclosure has a transverse-to-longitudinal aspect ratio that is less than 1, the enclosures being comprised of a metallic material; and
   an element of lossy material, the element of lossy material being disposed between at least one of the enclosures and the housing, each of the enclosures having at least one location thereon that is in conductive contact with the housing, wherein the element of lossy material in combination with the conductive contact between the enclosures and the housing, and in combination with the aspect ratios of the enclosures, provide the system assembly with an electromagnetic compatibility (EMC) solution that reduces electromagnetic radiation emissions emanating from the system assembly.

2. The system assembly of claim 1, wherein the housing has a plurality of elements of lossy material secured thereto at predetermined locations, the locations at which the elements of lossy material are secured to the housing corresponding to locations where portions of the enclosures of the subassemblies are in close proximity to the housing such that the elements of lossy material secured to the housing are in proximity with the enclosures of the subassemblies.

3. The apparatus of claim 2, wherein the housing has an element of material secured thereto which is comprised of a combination of conductive material and lossy material, wherein the element of conductive and lossy material is disposed at a location on said housing between said subassemblies.

4. The system assembly of claim 3, wherein said element of conductive material and lossy material located between the subassemblies constitutes a lossy gasket.

5. The system assembly of claim 3, wherein at least one of the elements of lossy material secured to the housing constitutes a lossy gasket.

6. The system assembly of claim 3, wherein the elements of lossy material and the element of lossy and conductive material together comprise an electromagnetic compatibility (EMC) solution which reduces an overall amount of electromagnetic compatibility being emitted from the system assembly such that the system assembly meets Federal Communications Commission (FCC) regulations.

7. The system assembly of claim 6, wherein the EMC solution also renders the electrical circuitry of the subassemblies immune to electromagnetic radiation generated by one or more sources outside of the system assembly.

8. The system assembly of claim 7, wherein the elements of lossy material are comprised of one or more lossy materials selected from the group consisting of:

dielectrically lossy polyethylene, dielectrically lossy rubber, dielectrically lossy neoprene and magnetically-filled silicon rubber.

9. A method for controlling electromagnetic radiation emissions being generated by electrical circuitry comprised in one or more subassemblies of a system assembly to reduce electromagnetic radiation emission emanating from the system assembly, the system assembly comprising a housing and a plurality of subassemblies, the subassemblies being mounted within the housing, each subassembly having at least a partial enclosure for at least partially enclosing the electrical circuitry, the enclosures and the housing being comprised of a metallic material, the method comprising the steps of:

locating the subassembly enclosures within the housing in such a way that at least one location on each enclosure is in conductive contact with the housing; and disposing an element of lossy material between at least one subassembly enclosure and the housing, each enclosure having at least one longitudinal side that is parallel to longitudinal walls of the housing, each enclosure having at least one transverse side that is parallel to a transverse wall of the housing, the transverse dimension of each enclosure being less than the longitudinal dimension of the enclosure such that each enclosure has a transverse-to-longitudinal aspect ratio that is less than 1, the element of lossy material absorbing electromagnetic radiation emitted by the electrical circuitry of the subassemblies to thereby reduce electromagnetic radiation emissions emanating from the system assembly.

10. The method of claim 9, further comprising the step of securing a plurality of elements of lossy material to the housing at predetermined locations on the housing, the locations at which the elements of lossy material are secured to the housing corresponding to locations where parts of the subassemblies are in close proximity to the housing such that the elements of lossy material secured to the housing are in close proximity with the enclosures of the subassemblies.

11. The method of 10, further comprising the step of securing an element of material to the housing that is comprised of a combination of conductive material and lossy material, wherein the element of conductive and lossy material is disposed at a location between said subassemblies.

12. The system assembly of claim 11, wherein said element of conductive material and lossy material located between the subassemblies constitutes a lossy gasket.

13. The method of claim 11, wherein at least one of the elements of lossy material secured to the housing constitutes a lossy gasket.

14. The method of claim 11, wherein the elements of lossy material and the element of lossy and conductive material together comprise an electromagnetic compatibility (EMC) solution which reduces an overall amount of electromagnetic radiation being emitted from the system assembly such that the system assembly meets Federal Communications Commission (FCC) regulations.

15. The method of claim 14, wherein the EMC solution also renders the electrical circuitry of the subassemblies immune to electromagnetic radiation generated by one or more sources outside of the system assembly.

16. The method of claim 15, wherein the elements of lossy material are comprised of one or more lossy materials selected of the group consisting of:

dielectrically lossy polyethylene, dielectrically lossy rubber, dielectrically lossy neoprene and magnetically-filled silicon rubber.

* * * * *

UNITED STATES PATENT AND TRADEMARK OFFICE
CERTIFICATE OF CORRECTION

PATENT NO. : 6,274,807 B1
DATED : August 14, 2001
INVENTOR(S) : Pommerenke et al.

It is certified that error appears in the above-identified patent and that said Letters Patent is hereby corrected as shown below:

<u>Column 6,</u>
Line 40, after "strip 17 is" delete first instance of "comprised of a"

<u>Column 8,</u>
Line 10, after "materials" insert -- . -- and delete "which is know as"

<u>Column 9,</u>
Line 3, delete "compatibility" and insert therefor -- radiation --

Signed and Sealed this

Seventh Day of October, 2003

JAMES E. ROGAN
*Director of the United States Patent and Trademark Office*